(12) United States Patent
Tsividis et al.

(10) Patent No.: US 7,911,257 B2
(45) Date of Patent: Mar. 22, 2011

(54) MOSFET PARAMETRIC AMPLIFIER

(75) Inventors: Yannis Tsividis, New York, NY (US);
Sanjeev Ranganathan, New York, NY (US)

(73) Assignee: The Trustees of Columbia University in the city of New York, New York, NY (US)

( * ) Notice: Subject to any disclaimer, the term of this patent is extended or adjusted under 35 U.S.C. 154(b) by 0 days.

(21) Appl. No.: 12/421,930

(22) Filed: Apr. 10, 2009

(65) Prior Publication Data

US 2009/0251196 A1     Oct. 8, 2009

Related U.S. Application Data

(63) Continuation of application No. 11/141,175, filed on May 31, 2005, now abandoned, which is a continuation of application No. PCT/US03/38401, filed on Dec. 2, 2003.

(60) Provisional application No. 60/430,302, filed on Dec. 2, 2002.

(51) Int. Cl.
*G06G 7/16*         (2006.01)
(52) U.S. Cl. ........... 327/356; 327/119; 330/4.5; 330/4.9
(58) Field of Classification Search ........................ None
See application file for complete search history.

(56) References Cited

U.S. PATENT DOCUMENTS

| | | | |
|---|---|---|---|
| 5,767,726 A * | 6/1998 | Wang | 327/356 |
| 6,265,934 B1 | 7/2001 | Wood | |
| 6,639,446 B2 * | 10/2003 | Komurasaki et al. | 327/355 |
| 6,838,909 B2 | 1/2005 | Huang et al. | |
| 6,842,081 B2 * | 1/2005 | Wang et al. | 331/117 R |
| 7,164,325 B2 * | 1/2007 | Aparin et al. | 331/176 |
| 7,321,271 B2 * | 1/2008 | Takinami et al. | 331/117 R |
| 7,420,418 B2 * | 9/2008 | Park et al. | 330/277 |
| 2004/0056725 A1 | 3/2004 | Kitamura et al. | |
| 2007/0008208 A1 | 1/2007 | Lakdawala et al. | |
| 2008/0024223 A1 * | 1/2008 | Park et al. | 330/277 |
| 2008/0102777 A1 * | 5/2008 | Vice | 455/323 |
| 2009/0219086 A1 * | 9/2009 | Iida et al. | 330/4.9 |

OTHER PUBLICATIONS

Tsividis et al., "Strange Ways to use the MOSFET," IEEE International Symposium on Circuits and Systems, pp. 449-452, Jun. 1997, Okuda et al.

Krishnaswamy et al., "A Dual-Model 700-Mspamples/s 6- bit 200-Msamples/s 7-bit A/D Converter in a 0.25-um Digital CMOST Process," IEEE Journal of Solid State Circuits, vol. 35, No. 12, Dec. 2000.

(Continued)

*Primary Examiner* — Tuan Lam
(74) *Attorney, Agent, or Firm* — Baker Botts LLP

(57) ABSTRACT

A circuit includes an input terminal adapted to receive an input voltage, a MOSFET having its drain terminal and its source terminal connected together, a first switching arrangement configured to be controlled by a first clock signal and adapted to selectively couple the gate terminal to the input terminal, and a further switching arrangement configured to be controlled by a further clock signal in timing relationship with the first clock signal and adapted to selectively couple the source terminal and a first voltage which is capable of pulling carriers out of a channel when the first switching arrangement is not coupling the input terminal to the gate terminal.

4 Claims, 21 Drawing Sheets

OTHER PUBLICATIONS

Ranganathan et al., "A MOS Capacitor-Based Discrete Time Parametric Amplifier with 1.2 V Output Swing and 3pu Power Dissipation," IEEE International Solid-State Circuits Conference, Paper 23.1, 2003.

U.S. Appl. No. 11/141,175, filed May 31, 2005.

U.S. Appl. No. 11/141,175, Final Office Action-Oct. 10, 2008.

U.S. Appl. No. 11/141,175, Non-final Office Action Response-Jul. 16, 2008.

U.S. Appl. No. 11/141,175, Non-final Office Action-Jan. 16, 2008.

* cited by examiner

MOSFET PARAMETRIC AMPLIFIER

PRIORITY AND RELATED APPLICATION

This application is a continuation of U.S. patent application Ser. No. 11/141,175, filed May 31, 2005 now abandoned, which is a continuation of International Application No. PCT/US03/038401, filed Dec. 2, 2003, published Jun. 17, 2004, which claims priority to United States Provisional Application No. 60/430,302, filed on Dec. 2, 2002, entitled "Applications of the Discrete-Time MOSFET Parametric Amplifier," each of which are incorporated by reference in their entireties herein, and from which priority is claimed.

FIELD OF THE INVENTION

This invention relates generally to electrical circuits, and more particularly, to circuits which include MOSFET parametric amplifiers.

BACKGROUND INFORMATION

Issues such as noise and power consumption need to be addressed in many electrical engineering applications, such as mixer circuits, charge pump circuits, pipeline converters, and comparator circuits.

For example, a sampling mixer circuit requires a quality amplifier, and designing a quality amplifier can be challenging, as circuit designers have to address issues such as sampling noise and power consumption. It is desirable to employ an amplifier in a sampling mixer circuit which dissipates as little power as possible.

A charge pump circuit typically requires a large quantity of switches in order to maintain and boost voltage levels to the desired value. It is desirable to be able to change the capacitance of a circuit element by changing the source (or drain) voltage of the circuit, rather than by activating large quantities of switches. This may prevent the need to generate complex clocking waveforms.

Pipeline converters generally require op amps, sampling capacitors, and capacitors in feedback in order to control the gain. The bandwidth of op amps is approximately 10 times the frequency of operation, and therefore, the pipeline converters of the prior art generally consume a great deal of power. Avoiding the use of an op amp is thus desired, but a suitable substitute should be used in its place, especially a substitute having the advantages of higher speed and lower power consumption.

A comparator is a circuit element that compares two incoming signals and gives a digital output indicating which is larger. Comparator circuits typically require preamps before the latch because their use reduces the input referred offset by the amount of the gain of the preamp. The preamps dissipate static power and result in larger power consumption. In order to reduce power consumption, elimination of such a preamp in this circuit is desirable.

The following references are incorporated herein by reference in their entirety: Y. Tsividis, K. Suyama "Strange ways to use the MOSFET," IEEE International Symposium on Circuits and Systems, pp. 449-452, June 1997; N. Krishnaswamy et al., "A Dual-Model 700-Msamples/s 6-bit 200-Msamples/s 7-bit A/D Converter in a 0.25-um Digital CMOST Process"; and S. Ranganathan, Y. Tsividis, "A MOS Capacitor-Based Discrete-Time Parametric Amplifier with 1.2 V Output Swing and 3 µW Power Dissipation," IEEE International Solid-State Circuits Conference, Paper 23.1, 2003.

SUMMARY OF THE INVENTION

An object of the present invention is to overcome the aforementioned drawbacks of the prior art. A parametric amplifier may be used in the aforementioned circuits and others to provide improvements over prior art circuits. The use of a parametric amplifier makes very low power, low-noise, large-signal amplification possible, which was not possible with earlier techniques.

A MOS capacitor is a MOSFET with its drain and source terminals connected together. The drain and source terminals thus function as a single terminal. This configuration of MOSFET results in a three-terminal MOS varactor. The three terminals are the gate terminal, the commonly connected source/drain terminal, and a substrate or backgate terminal.

A voltage sampled on the gate of an MOS capacitor rises when the channel charge is depleted. This effect is the basis of a parametric amplifier that draws little or no DC current and may be noiseless.

FIGS. 1-3 show the details of the operation of the parametric amplifier. In these Figs., the source and drain regions are both n-type while the bulk material is p-type.

At time $t_1$, as depicted in FIG. 1, the commonly connected source/drain terminal S of the MOS capacitor may be connected to its bulk terminal B (also referred to as its substrate terminal or backgate terminal). A switch $\phi$ may connect an input voltage $V_i$ to the gate terminal G, with $V_i$ being large enough to strongly invert the channel. The sum of the inversion charge $Q_i$ and the depletion charge $Q_b$ may be equal to the negative of the gate charge $Q_g$ for charge neutrality, assuming negligible interface charge.

At time $t_2$, after the switch $\phi$ has been opened, the input voltage $V_i$ may be sampled on the gate G of the MOS capacitor as depicted in FIG. 2. The charge on the gate $Q_g$ is prevented from changing. The inversion and depletion charge distribution in the bulk may remain the same as at $t_1$. The gate voltage $V_g$ is the sum of the voltage drops across the oxide $V_{ox}$ and the voltage across the bulk $V_b$. It can be shown that for a fixed gate charge, the voltage drop of the oxide is fixed. It can also be shown that the voltage drop across the bulk $V_b$ is an increasing function of the magnitude of the depletion charge $Q_b$.

At time $t_3$, with the switch $\phi$ still open, a large positive voltage $V_{pull}$ may be applied to the source/drain terminal S, as depicted in FIG. 3. The pulling voltage may eliminate the entire inversion charge $Q_i$ leaving only depletion charges $Q_b$. To balance the gate charge $Q_g$ with the charge in the bulk, the depletion charge magnitude may increase by the same amount that the inversion charge magnitude decreases. The increase in depletion charge magnitude may mandate an increase in the voltage drop across the bulk. As the voltage drop across the oxide is fixed, this increase in voltage may reflect directly as an increase in the gate voltage. The output is the gate voltage during the boosting phase. FIG. 4 depicts the voltage waveforms at certain terminals by FIGS. 1-3 in graphical form.

Referring to FIG. 5, the upper curve 510 represents the total gate charge versus gate voltage during the hold phase (i.e., when the S terminal is grounded and input is sampled on the gate.) The lower curve 520 shows the gate charge during the boost phase, (i.e., when the inversion charge is removed.) Since the gate charge remains constant, in operation the gate voltage can be seen to increase from $V_{I1}$ 530 to $V_{O1}$ 540.

FIG. 6 depicts two parametric amplifiers used in a differential operation. Although bias and signal are not distinguishable in a single sampled voltage, it is possible to differentiate between them in a differential setup. The circuit is similar to the embodiment of FIG. 10 (described hereafter). However, two parametric amplifiers are used, with each of their source/drain terminals connected. The common source/drain terminal 606 may be selectively coupled to a pulling voltage. When the switching arrangements 602, 604 are closed, the pulling voltage is coupled to ground (ie, in the holding phase). When the switching arrangements 602, 604 are open, the pulling voltage is coupled to the common source terminal 606 (ie, in the boosting phase).

FIG. 7 depicts the sampled voltages at the gates of the two amplifiers be $V_{I1}$ and $V_{I2}$. Following the operation in FIG. 5, we can obtain $V_{O1}$ and $V_{O2}$ as their corresponding outputs. The differential voltage $\Delta V_O$ may be defined as the output and the gain is defined as $\Delta V_O/\Delta V_I$. Note that the slopes of the two characteristics in FIG. 7 may correspond to the small signal capacitances of the structures in the two phases. In the hold phase (corresponding to upper curve 710) the inversion charges may be present right under the gate forming a parallel plate capacitance. The capacitance of the structure in the hold phase may then be $C_{ox}$. In the boost phase (corresponding to lower curve 720) in the absence of the inversion charges, the capacitance of the structure may be the series combination of the oxide capacitance and the depletion layer capacitance; this combination may be denoted by $C_{gb}$ and may be smaller than $C_{ox}$. The changes $\Delta V_O$ and $\Delta V_I$ may hence be related by the slopes as seen from FIG. 7 as: $\Delta V_O = C_{ox}/C_{gb} \Delta V_I$. Typical gain may vary from 5 to 10, depending on the fabrication process.

The gain (of a differential circuit or single ended circuit) is unloaded i.e. based on the assumption that the gate is floating. Parasitic and load capacitance will lower this gain, as is depicted in FIG. 8. If the parasitic capacitance is Cp the gain would be:

$$\Delta V_O = (C_{ox} + C_p)/(C_{gb} + C_p) \Delta V_I$$

FIG. 9 depicts the dynamic power dissipation of a parametric amplifier. The dynamic power dissipation is the power required to pull out the inversion charge $Q_I$ from a layer of the channel under the gate during the boosting event. The energy drawn from power supply $V_{PULL}$ per boosting event is $V_{PULL} * Q_I$, with $Q_I \approx C_{ox}(V_G - V_T)$. For a sampling frequency of $f_c$ there are $f_c$ events per second, and dynamic power may be given by:

$$P_{diss} = f_c * V_{PULL} [C_{ox}(V_G - V_{T0})].$$

An example of power dissipated at 100 kHz, with $V_{pull}$ equal to 3.3 V, with a 2 pF for $C_{ox}$, a gate voltage of 2 Volts, and $V_{T0}$ equal to 0.5 Volts is shown to be 1 µW.

Unless otherwise noted, the embodiments shown in this application use n-MOS parametric amplifiers. The present invention, however, is equally applicable to p-MOS parametric amplifiers. With an n-MOS parametric amplifier, the source and drain voltage (ie, the pulling voltage) may be low (or grounded) when the input voltage is being sampled (ie, when a switch connecting the input terminal to the gate terminal is closed). When the switch is open, the source and drain voltage may be high. The converse is true with a p-MOS parametric amplifier. That is, with a p-MOS, the source and drain voltage may be high when the input voltage is being sampled (ie, when a switch connecting the input terminal to the gate terminal is closed). When the switch is open, the source and drain voltage may be low (or grounded).

In a one exemplary embodiment of the present invention, a mixer circuit includes a MOSFET parametric amplifier.

In another exemplary embodiment of the present invention, a charge pump circuit includes a MOSFET parametric amplifier.

In another exemplary embodiment of the present invention, an analog Finite Impulse Response ("FIR") filter includes a MOSFET parametric amplifier.

In another exemplary embodiment of the present invention, a circuit includes a MOSFET parametric amplifier capable of a gain of approximately 2.

In another exemplary embodiment of the present invention, a bootstrapping circuit includes a MOSFET parametric amplifier.

In another exemplary embodiment of the present invention, a preamplifier in a comparator circuit includes a MOSFET parametric amplifier.

Figure 1:
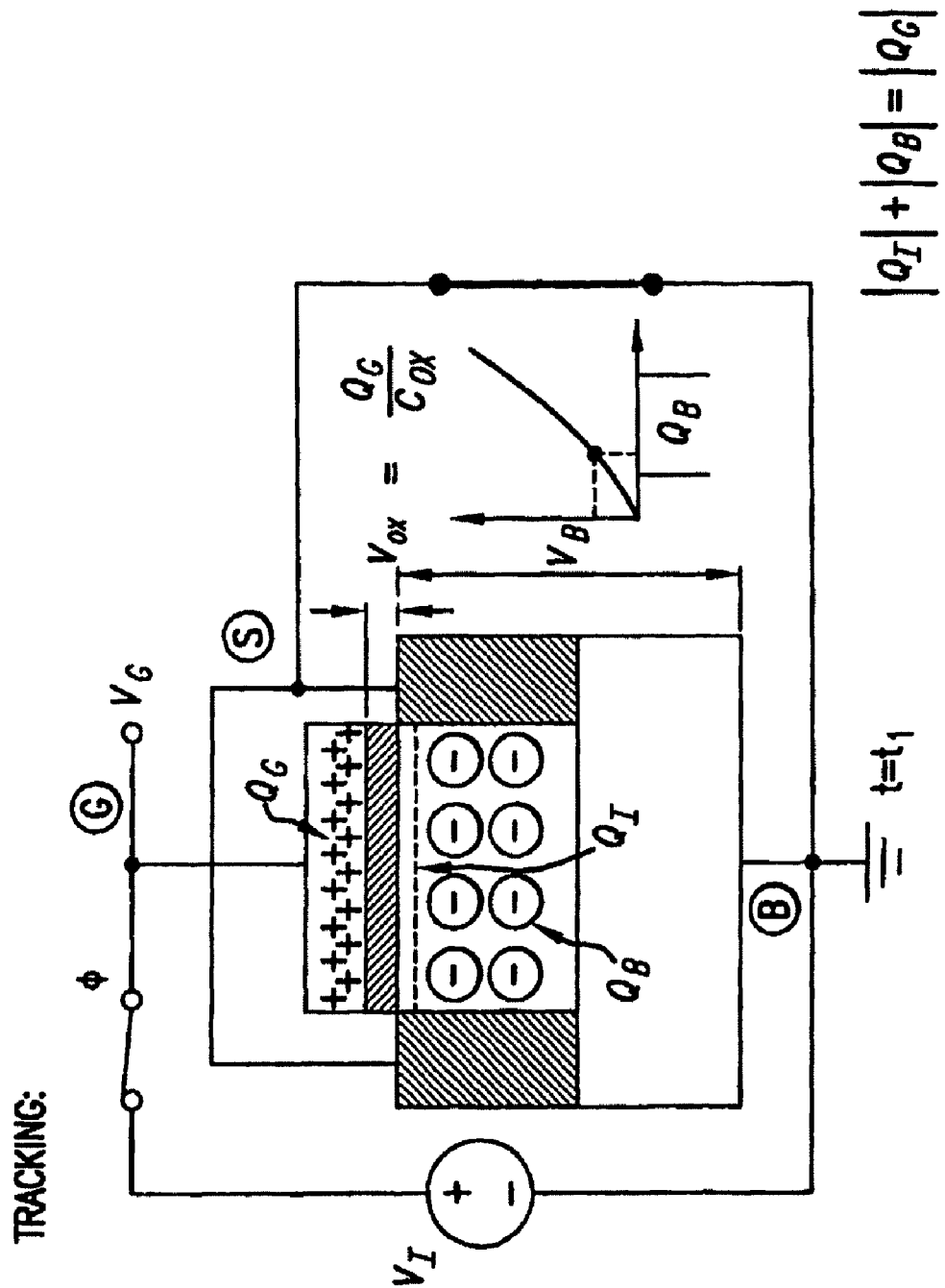
FIG. 1 shows charge distribution during the tracking phase of an n-MOS parametric amplifier according to an exemplary embodiment of the present invention.
Figure 2:
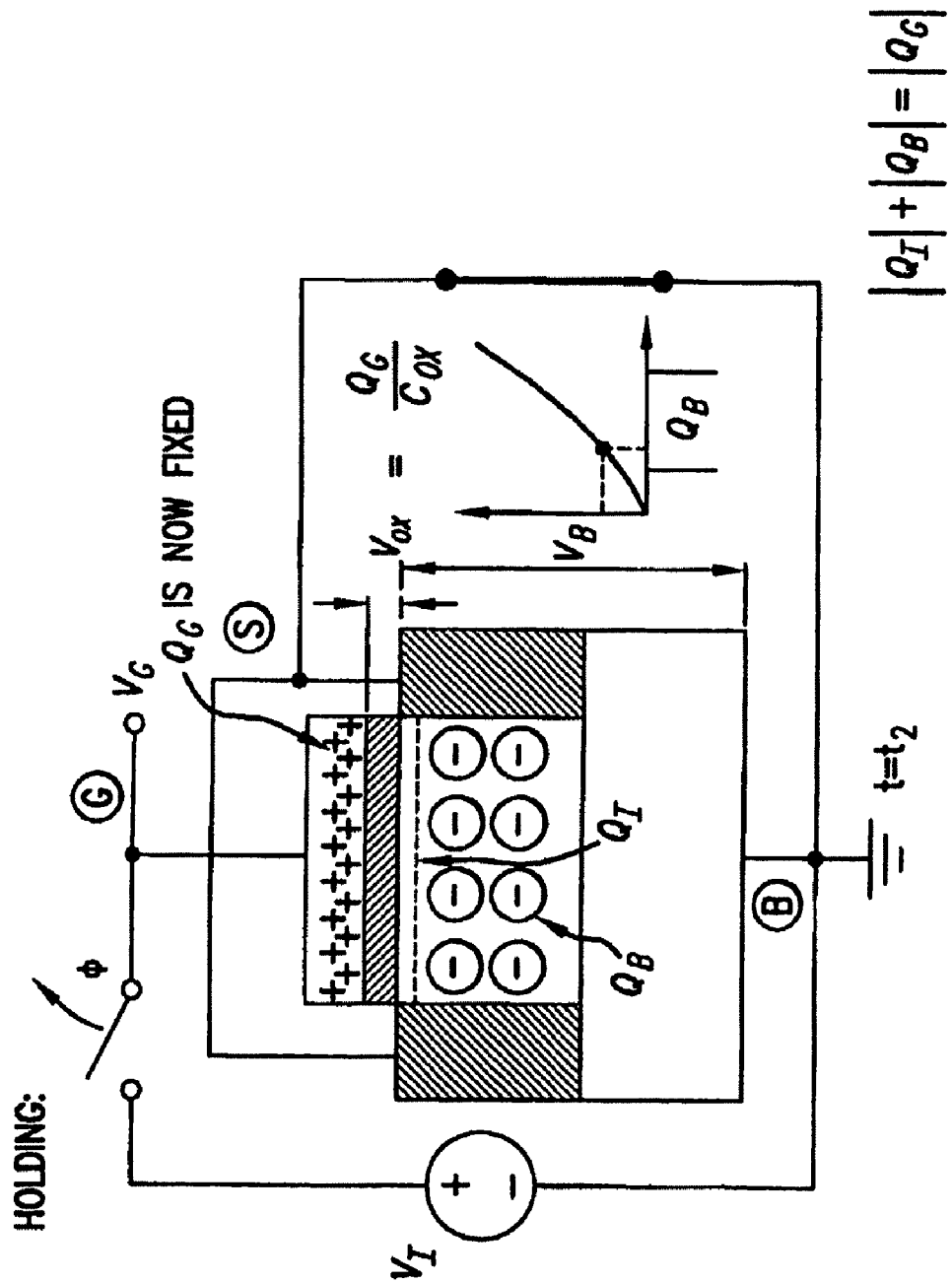
FIG. 2 shows charge distribution during the holding phase of an n-MOS parametric amplifier according to an exemplary embodiment of the present invention.
Figure 3:
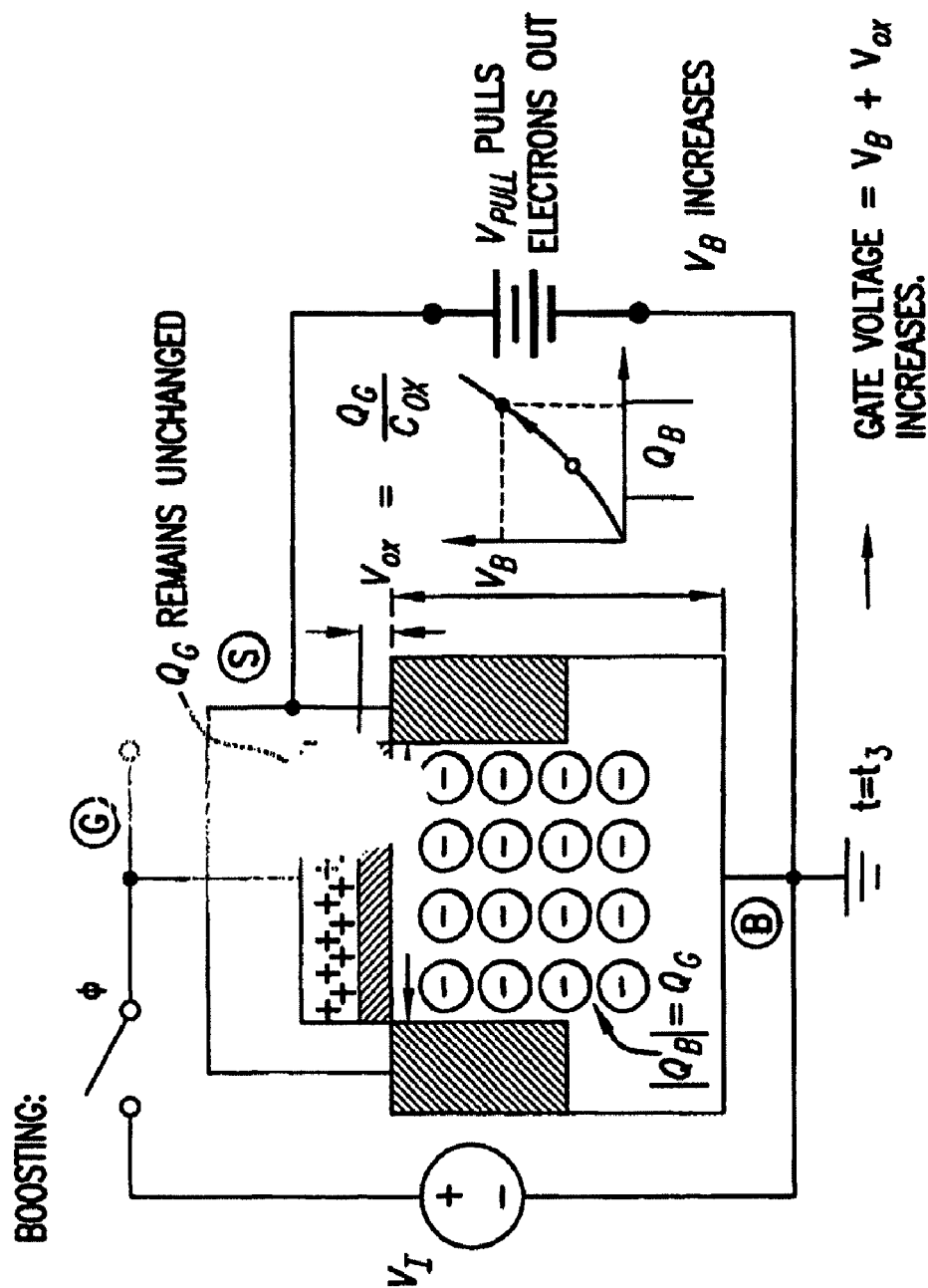
FIG. 3 shows charge distribution during the boosting phase of an n-MOS parametric amplifier according to an exemplary embodiment of the present invention.
Figure 4:
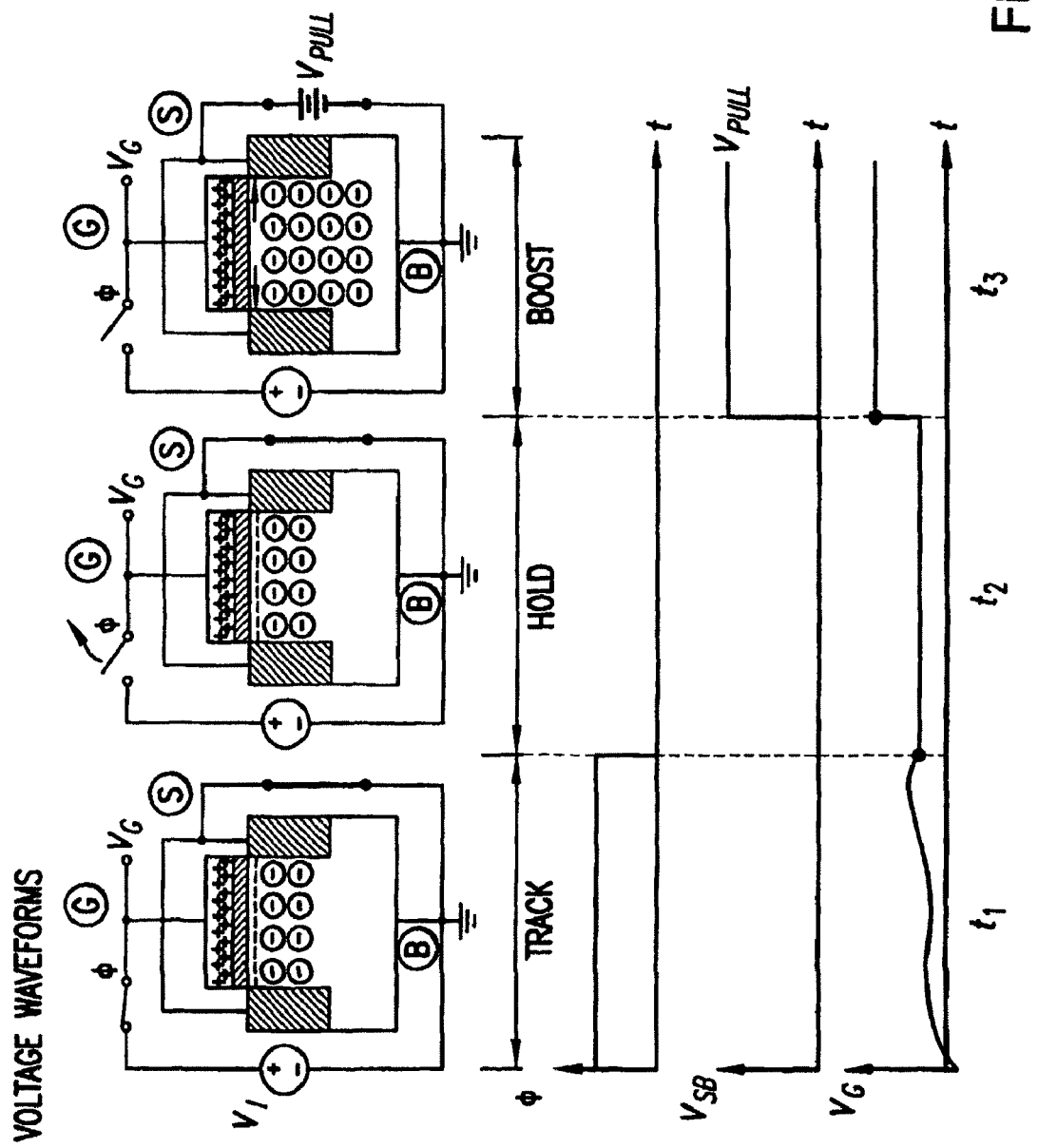
FIG. 4 shows the waveforms generated from FIGS. 1-3.
Figure 5:
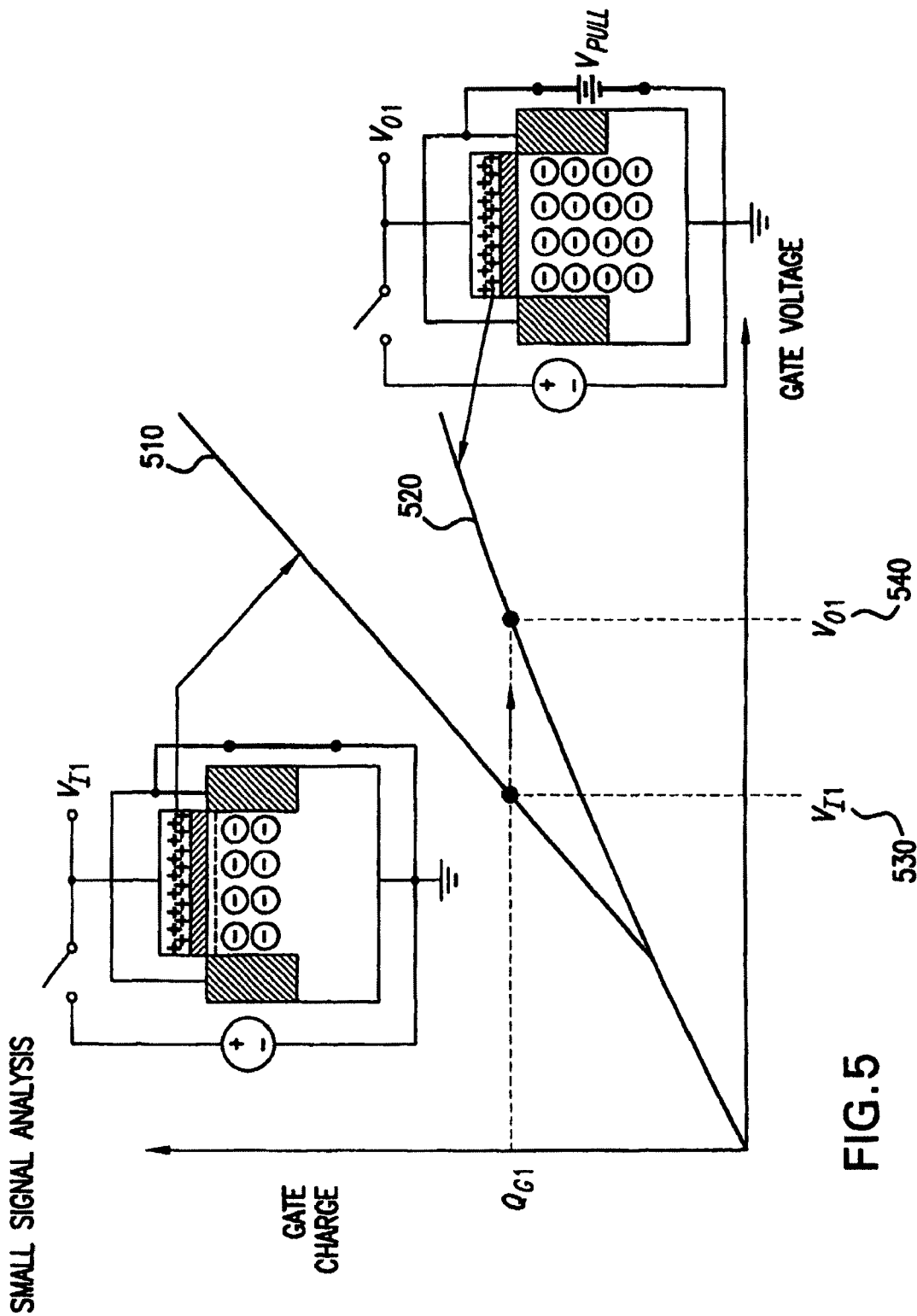
FIG. 5 shows the relationship between total gate charge versus gate voltage during the holding phase and boosting phases of FIGS. 2 and 3.
Figure 6:
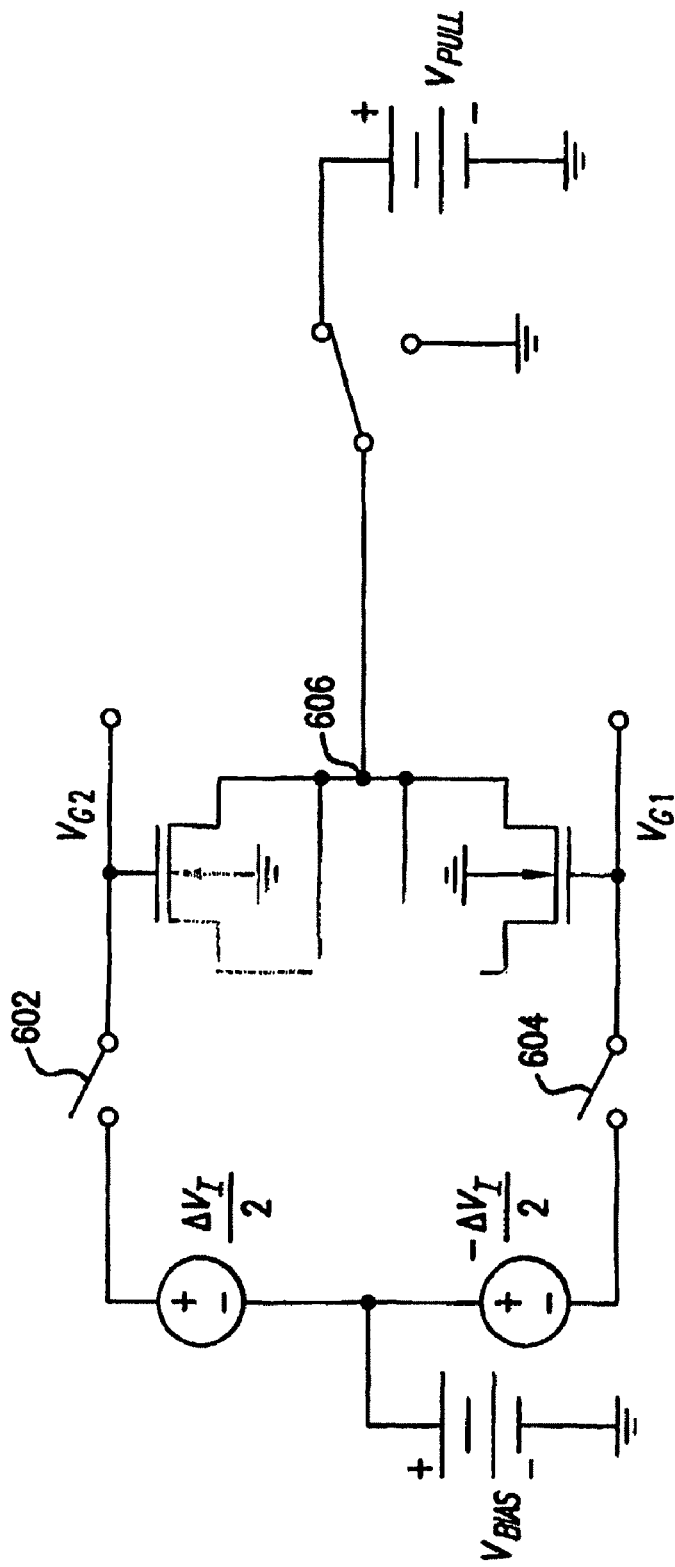
FIG. 6 shows two parametric amplifiers in differential operation according to an exemplary embodiment of the present invention.
Figure 7:
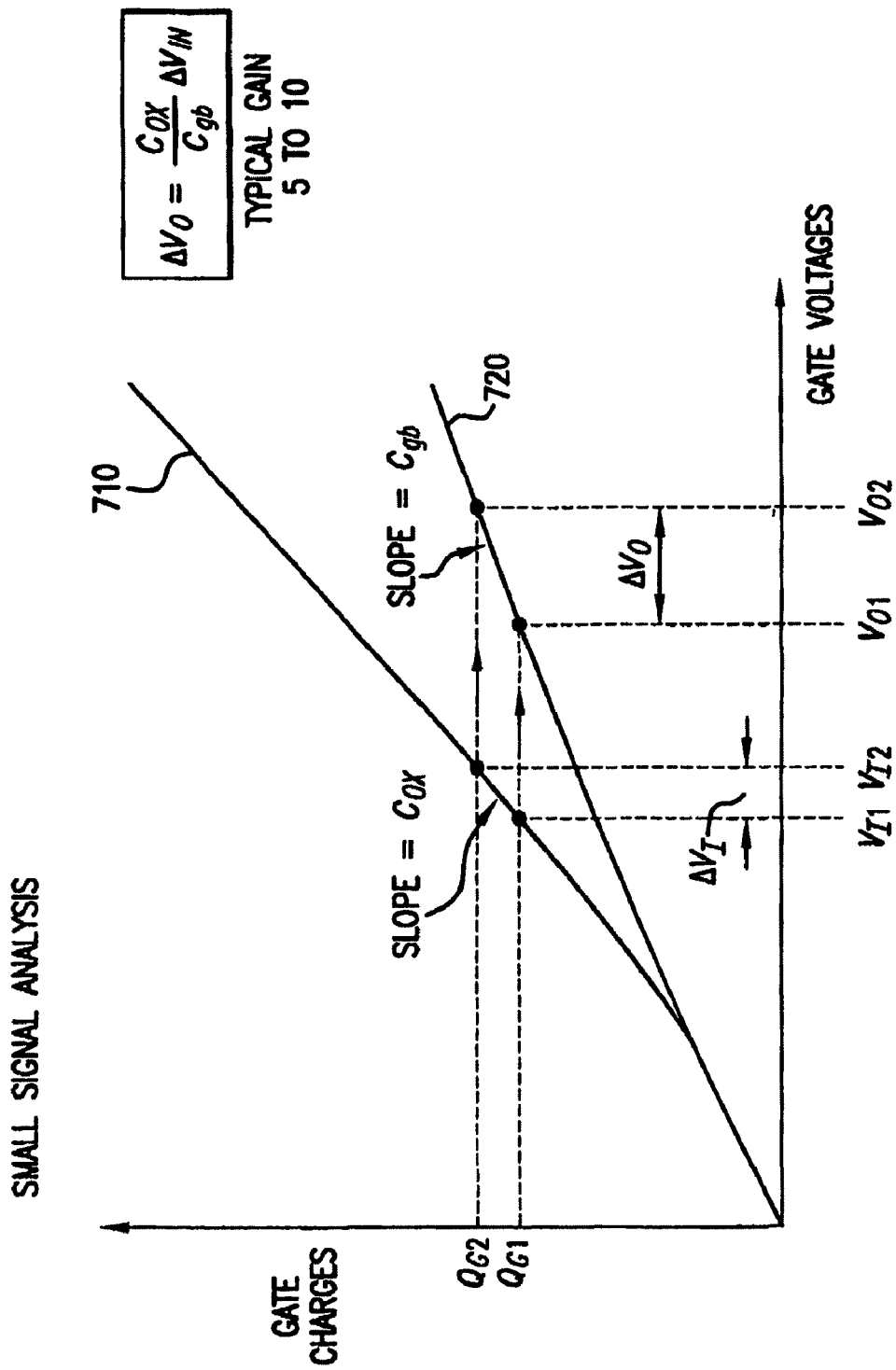
FIG. 7 shows the relationship between total gate charge versus gate voltage during the holding phase and boosting phases of FIG. 6.
Figure 8:
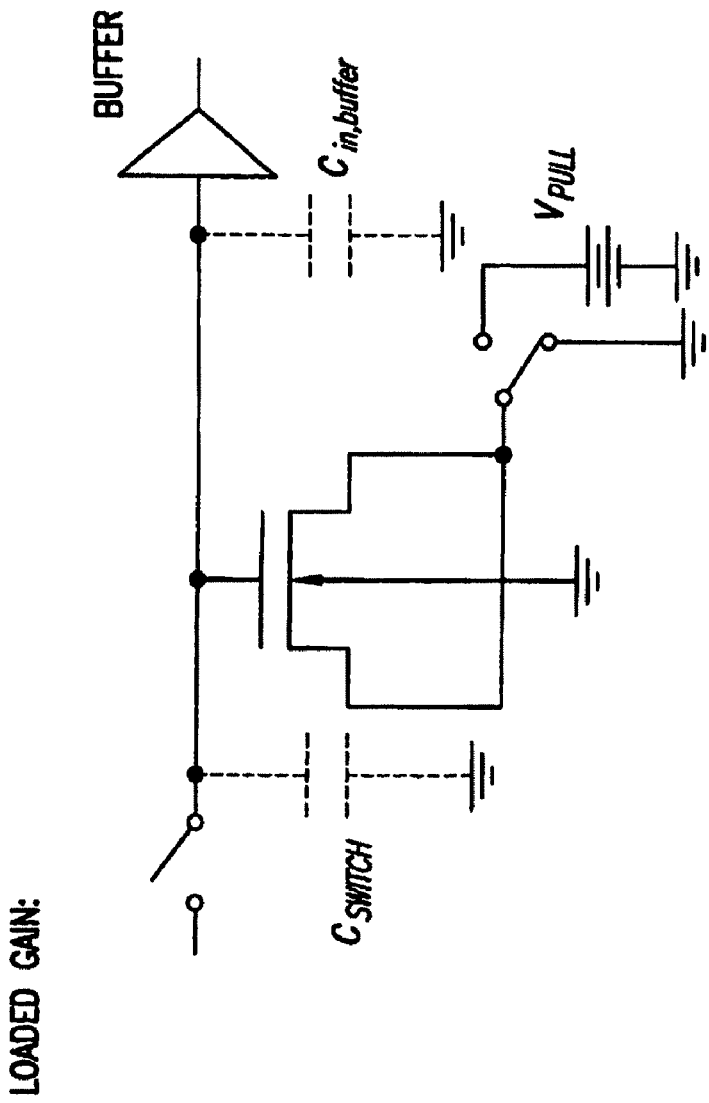
FIG. 8 shows how parasitic capacitance may reduce gain due to charge sharing with an amplifier.
Figure 9:
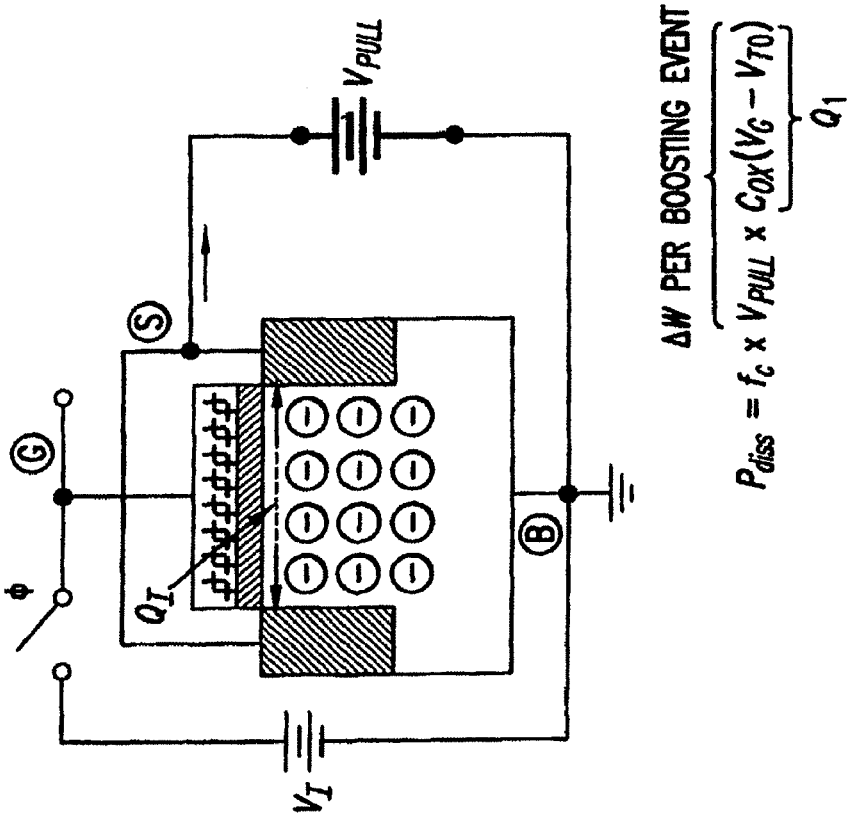
FIG. 9 shows the dynamic dissipation of power of a parametric amplifier.

Throughout the figures, the same reference numerals and characters, unless otherwise stated, are used to denote like features, elements, components or portions of the illustrated embodiments. Moreover, while the present invention will now be described in detail with reference to the figures, it is done so in connection with the illustrative embodiments.

DETAILED DESCRIPTION

FIGS. 10-14 may have particular relevance to mixer circuits.

Figure 10:
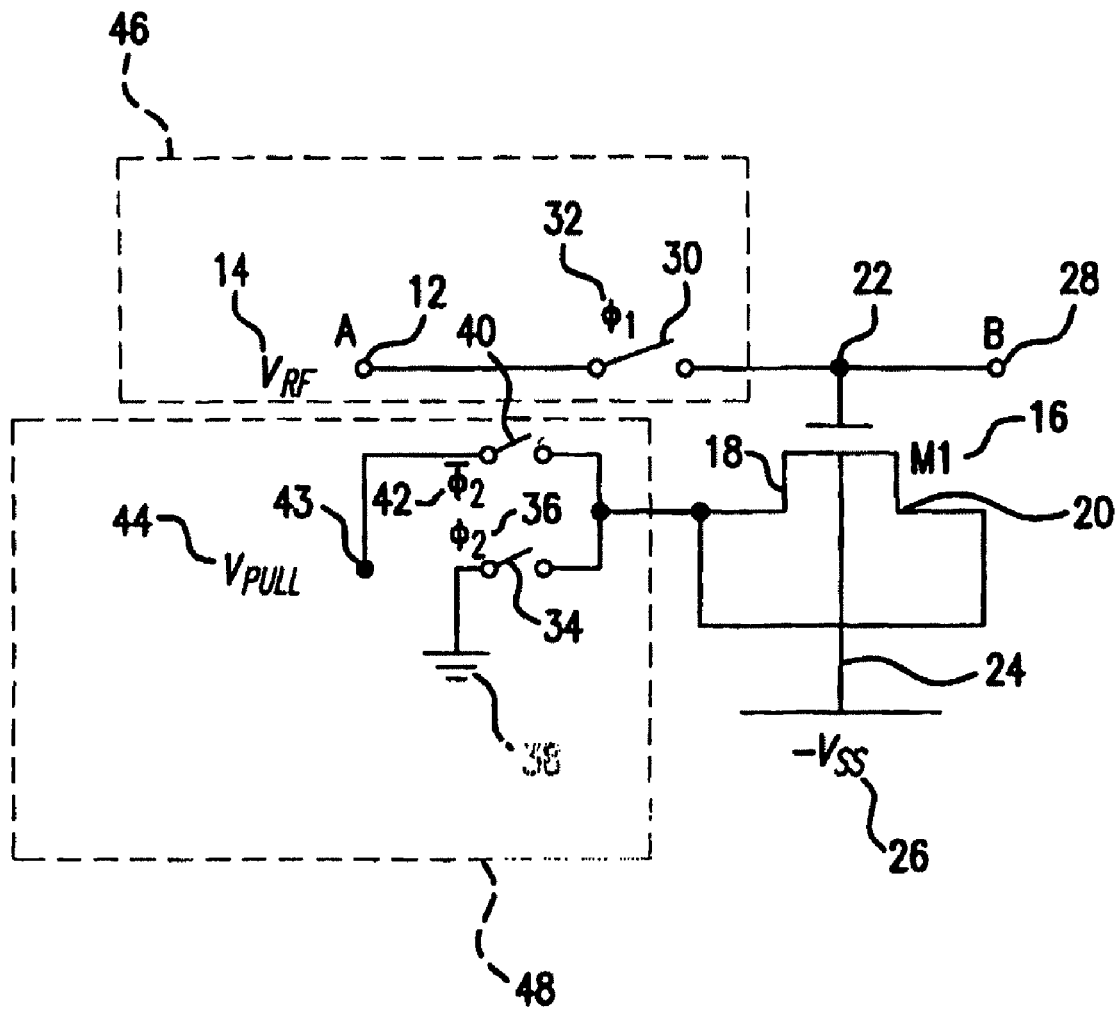
FIG. 10 shows a mixer circuit according to another exemplary embodiment of the present invention.

FIG. 10 depicts a first exemplary embodiment according to the present invention. A circuit may include an input terminal 12 adapted to receive an input voltage 14 which may be an RF (Radio Frequency) voltage. The circuit may include a MOSFET 16 including a source terminal 18, a drain terminal 20, a gate terminal 22, and a substrate or backgate terminal 24 adapted to be coupled to a substrate voltage source 26. Alternatively, the substrate terminal 24 may be coupled to ground. The drain terminal 20 and the source terminal 18 may be jointly connected. An output terminal 28 may be electrically coupled to the gate terminal 22. A first switching arrangement 30 may be configured to be controlled by a first clock signal 32. The first switching arrangement may be adapted to selectively couple the output terminal 28 and the input terminal 12. A second switching arrangement 34 may be configured to be controlled by a second clock signal 36 which may be associated with the first clock signal 32. The second switching arrangement 34 may be adapted to selectively couple the source terminal 18 to ground 38. A third switching arrangement 40 may be configured to be controlled by a third clock signal 42 which may be the second clock signal 36 shifted 180 degrees out of phase. The third switching arrangement 40 may be adapted to selectively couple the source terminal 18 and a pulling voltage 44. Alternatively, the second switching arrangement 34 may be adapted to selectively couple the source terminal 18 to the pulling voltage 44 and the source terminal 18 to ground. Carriers may be pulled out of the channel when the first switching arrangement 30 is not coupling the input terminal 12 and the gate terminal 22. Using an n-MOS parametric amplifier, carriers may be pulled out of the channel when the source terminal 18 is coupled to the pulling voltage 44. Using a p-MOS parametric amplifier, carriers may be pulled out of the channel when the source terminal 18 is coupled to ground 38.

Figure 11:
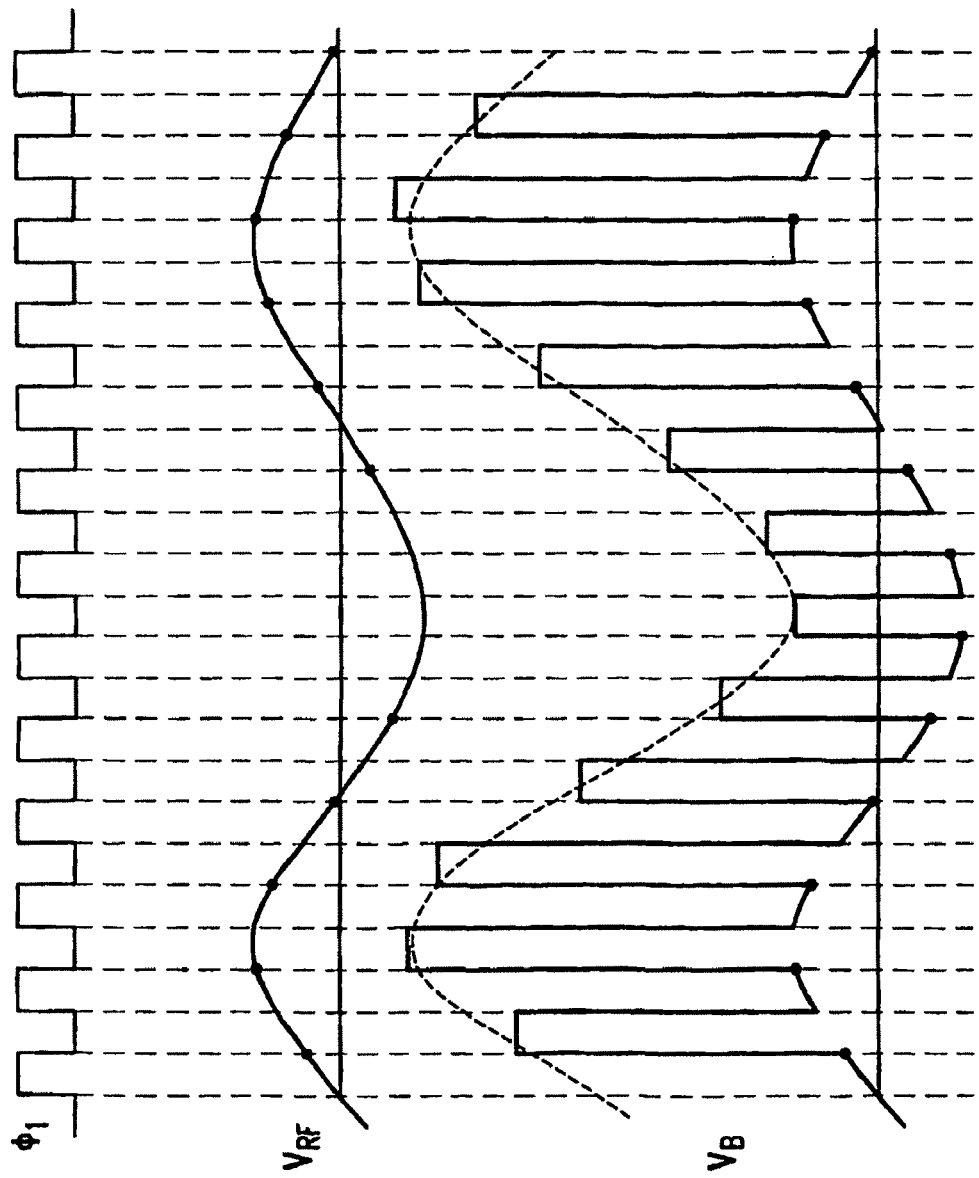
FIG. 11 shows the output voltage resulting from the input voltage of the circuit of FIG. 10.

Referring to FIG. 11, $\phi_1$ may be the first clock signal 32 and may be produced by a local oscillator (LO). $\phi_2$ may be the second clock signal 36 and may be equal to the first clock signal 32 or slightly modified to avoid its complement from overlaps with $\phi_1$. The pulling voltage 44 may pull out the carriers from the channel after $\phi_1$ has opened the top switch 30. The waveforms may be as depicted in FIG. 11.

In other words, when $\phi_1=1$, then $v_B=v_{RF}$; and when $\phi_1=0$, $v_B=$a multiple of the value $v_{RF}$ had just before the switch opened. Thus $v_B$, the voltage at the output terminal 28 may correspond to the sum of a dropped version of $v_{RF}$ 14, plus an amplified version of a sampled-and-held (for part of the cycle) version of $v_{RF}$ 14. The important benefit of this technique is that the parametric amplification may be noiseless, if a low-resistance connection to the substrate of the MOS capacitor M1 is ensured. If a low-resistance connection is also ensured to the channel of the MOS device M1, high-speed operation may be achieved.

Since both components of VB contain frequency components at $f_{RF}\pm f_{LO}$, mixer operation may be achieved. Mixing at $f_{RF}\pm nf_{LO}$ may also be achieved, with n representing an integer.

Figure 12:
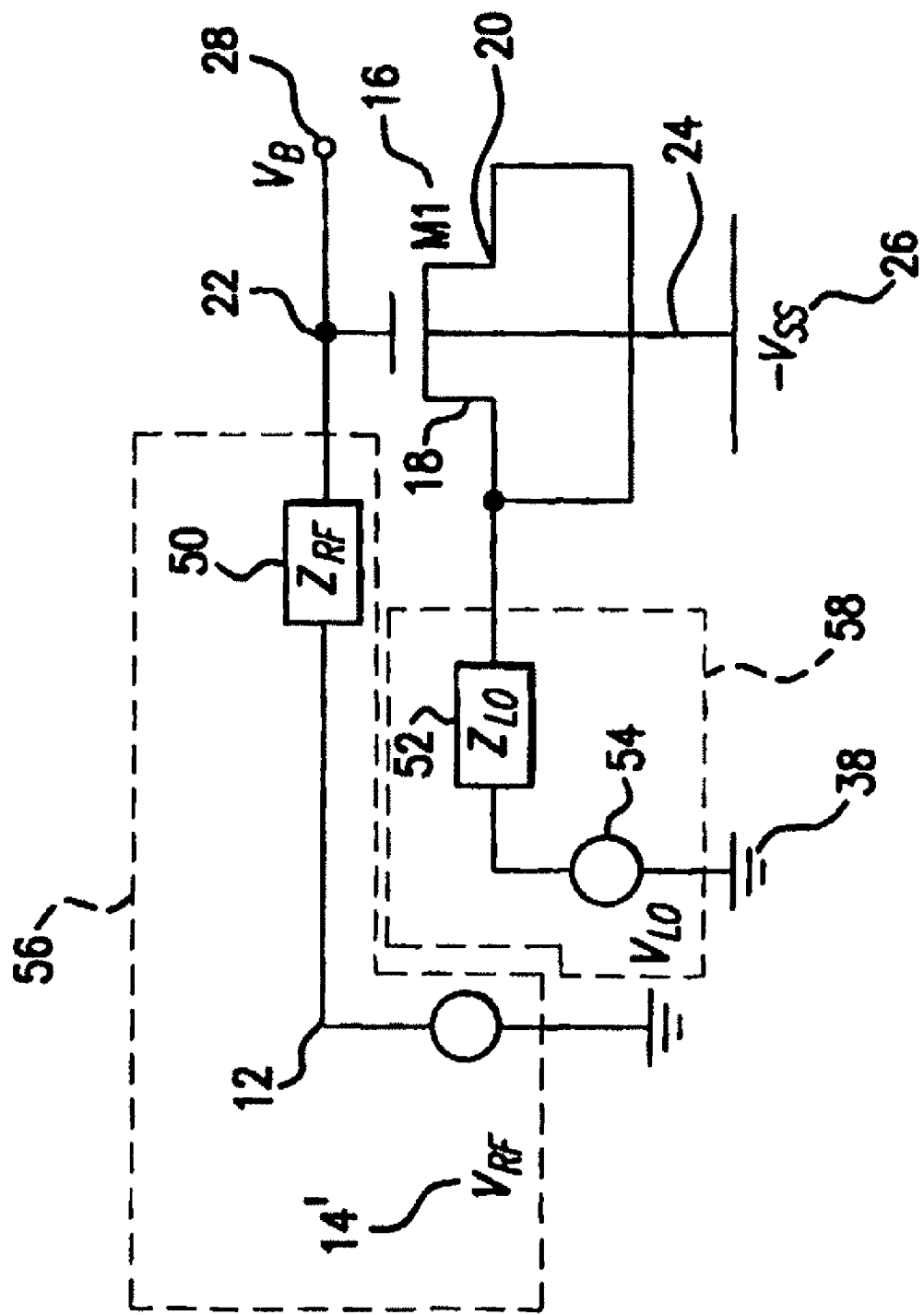
FIG. 12 shows a mixer circuit according to another exemplary embodiment of the present invention

FIG. 12 depicts an alternate exemplary embodiment according to the present invention. It is similar to the embodiment of FIG. 13, but continuously-fed voltages are used in lieu of switching arrangements. A circuit may include an input terminal 12 adapted to receive an input signal 14'. The circuit may include a MOSFET 16 including a source terminal 18, a drain terminal 20, a gate terminal 22, and a substrate or backgate terminal 24 adapted to be coupled to a substrate voltage source 26. The drain terminal 20 and the source terminal 18 may be jointly connected. An output terminal 28 may be electrically coupled to the gate terminal 22. A first impedance 50 may be associated with the input signal 14' may be electrically coupled to the gate terminal 22 and the input terminal 12. A second impedance 52 may be associated with a local oscillator signal 54. The second impedance 52 may be configured to be electrically coupled to the local oscillator signal 54 and the source terminal 20. The varying voltage at the source terminal 20 may result in a varying impedance as seen from the gate terminal 22. This time varying impedance may result in mixing of the input signal 14 with the source signal 54 or harmonics of the source signal.

Figure 13:
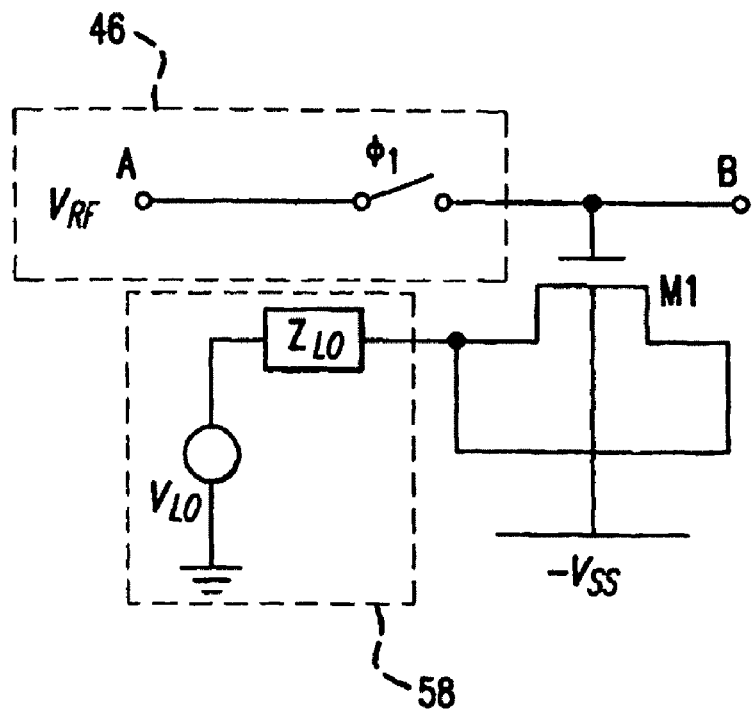
FIG. 13 shows a mixer circuit according to another exemplary embodiment of the present invention

In another alternate embodiment according to the present invention depicted in FIG. 13, a circuit is similar to the circuit depicted in FIG. 10. First circuit section 48 is replaced by second circuit section 58.

Figure 14:
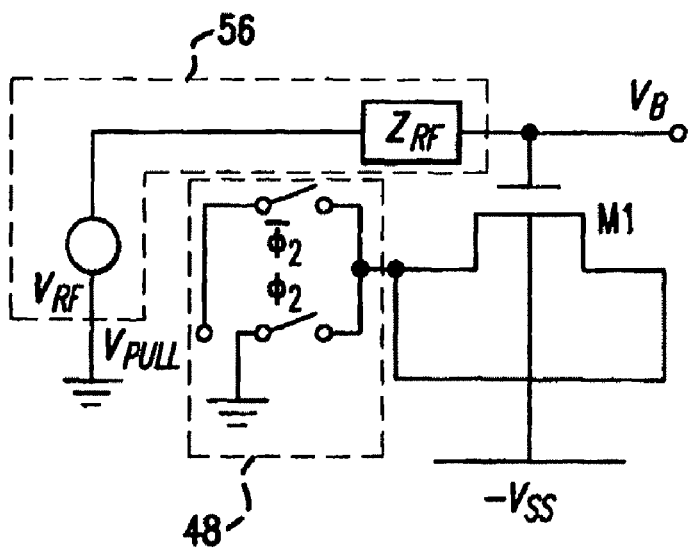
FIG. 14 shows a mixer circuit according to another exemplary embodiment of the present invention

In yet another alternate embodiment according to the present invention depicted in FIG. 14, a circuit is similar to the circuit depicted in FIG. 10. Third circuit section 46 is replaced by fourth circuit section 56.

Figure 15:
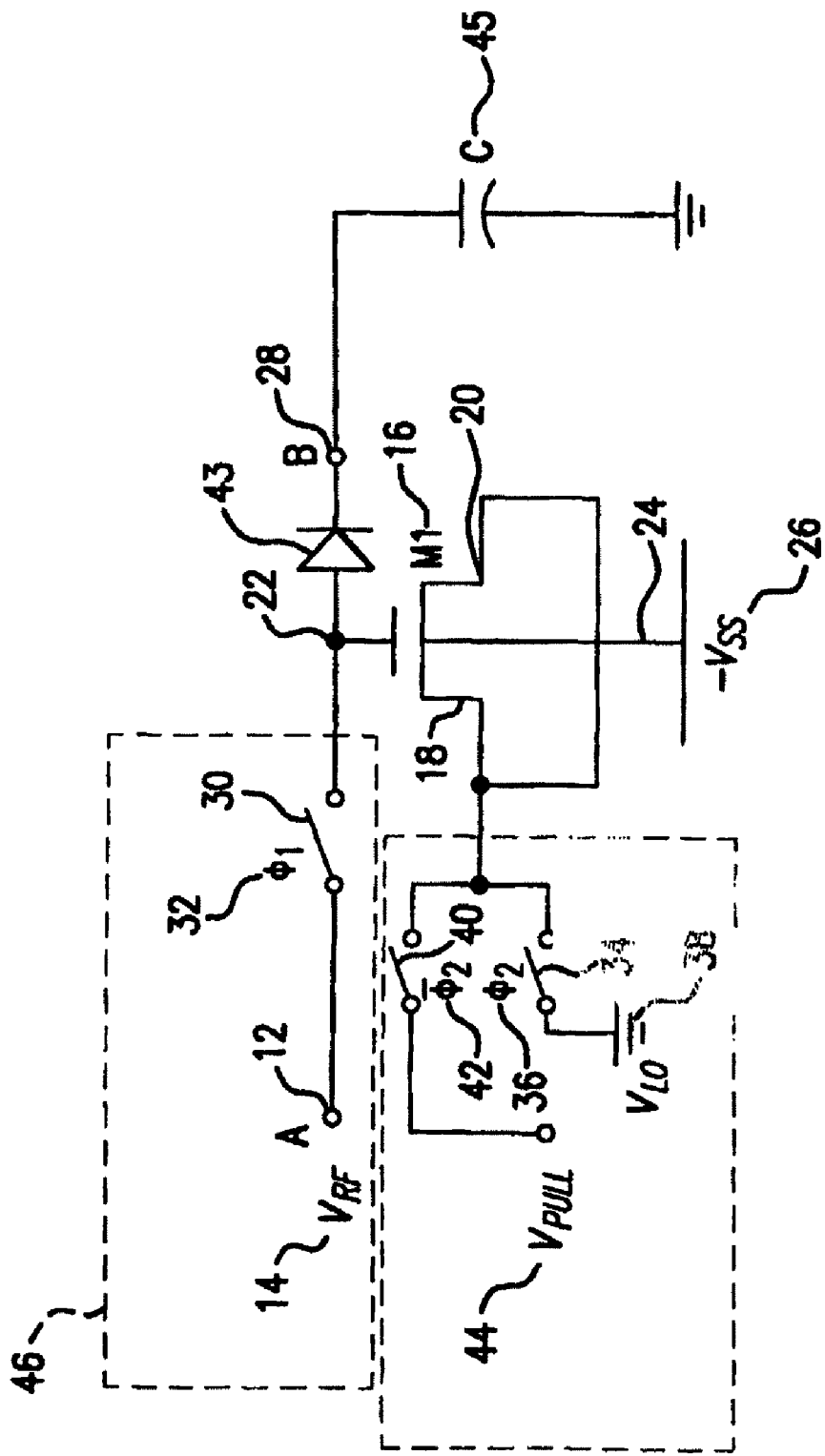
FIG. 15 shows a charge pump circuit according to another exemplary embodiment of the present invention.

FIG. 15 may have particular relevance to charge pump circuits.

FIG. 15 depicts a second exemplary embodiment according to the present invention, wherein a MOSFET parametric amplifier is used in a charge pump circuit. The circuit is similar to the embodiment of FIG. 10, but with a capacitor added in parallel with the output terminal 28. In this embodiment, as the output voltage at the output terminal 28 rises, the voltage at the gate terminal 22 may activate a diode 43 (or alternatively a diode-acting transistor or suitable switch). The gate charge may then be dumped on a following capacitor 45, which may be connected in parallel with the output terminal 28. This can be repeated many times, over many stages, creating a charge pump circuit.

Figure 16:
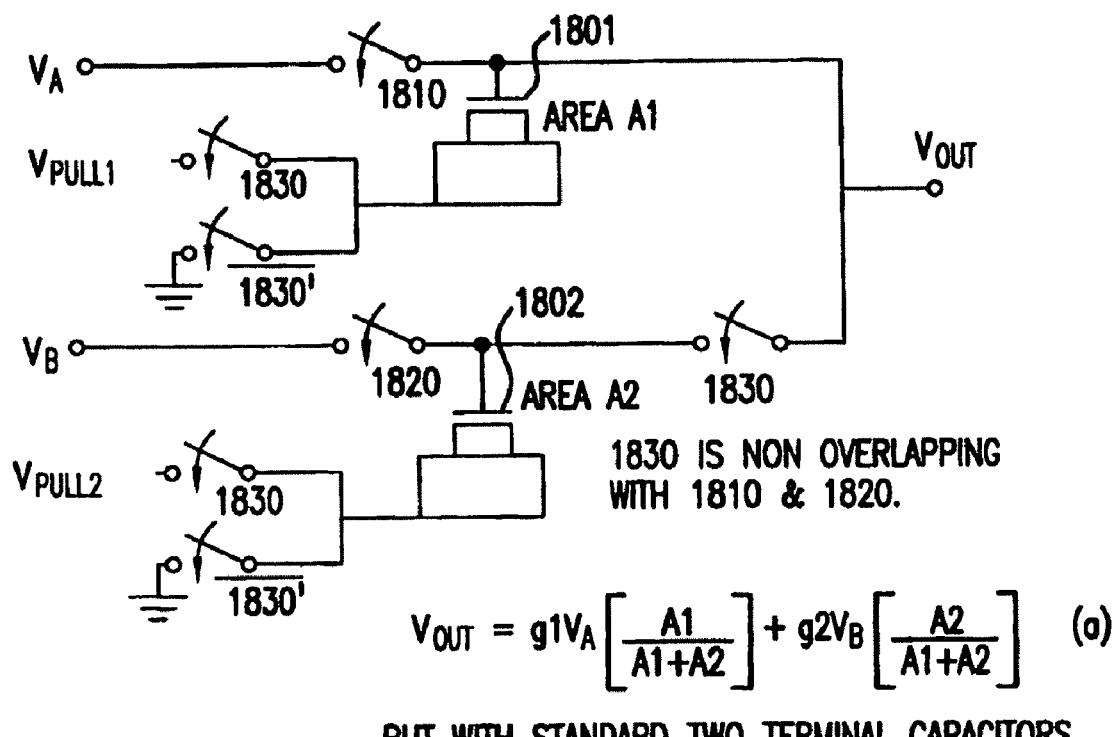
FIG. 16 shows a circuit functioning as a Finite Impulse Response Filter according to another exemplary embodiment of the present invention

FIG. 16 may have particular relevance to analog Finite Impulse Response ("FIR") filters.

FIG. 16 depicts a third exemplary embodiment according to the present invention. In this embodiment, a circuit which functions as an analog Finite Impulse Response ("FIR") filter uses a parametric amplifier. In analog FIR filters, signals are required to be scaled by different amounts to obtain coefficients of scaling. The filters with fixed coefficients may be implemented by using transistors of different sizes used as parametric amplifiers. FIG. 16 depicts an example with two gains. Input $V_a$ is sampled on first parametric amplifier 1801 when switching arrangement 1810 is closed. Input $V_b$ is sampled on second parametric amplifier 1802 when switching arrangement 1820 is closed. During the sampling, switching arrangements 1830', which may be the complement of 1830, may be closed ensuring that the source terminals are grounded. Once the inputs have been sampled (ie., input switch 1810 and 1820 are now open), switching arrangements 1830 may be closed, and switching arrangements 1830' may be opened. The sampled signals are combined together when switch 1830 is closed, and boosted. This may result in an output voltage as shown in equation (a) in FIG. 16.

If two standard two-terminal capacitors (not shown) used rather than parametric amplifiers 1801, 1802, the strength of the output signal will drop due to charge sharing between the two capacitors, as shown in equation (b) in FIG. 16. Using a parametric amplifier, the signal strength may be maintained and even gained up in the process.

Variable gains may also be achieved. The gain in the parametric amplifier depends on the bias voltage and the boosting voltage. It is indicated that to get maximum gain all the inversion charges are pulled out through the source. It is however possible to get intermediate gains depending on the input bias voltage and the value of the boosting voltage by only partially pulling out the inversion charges. Thus variable gains may be achieved dynamically by using various values for the $V_{pull}$. $V_{pull1}$, may be associated with gain coefficient g1, while $V_{pull2}$ may be associated with gain coefficient g2. The variable gains can additionally be used to dynamically change the coefficients, giving larger flexibility to the designer.

Figure 17:
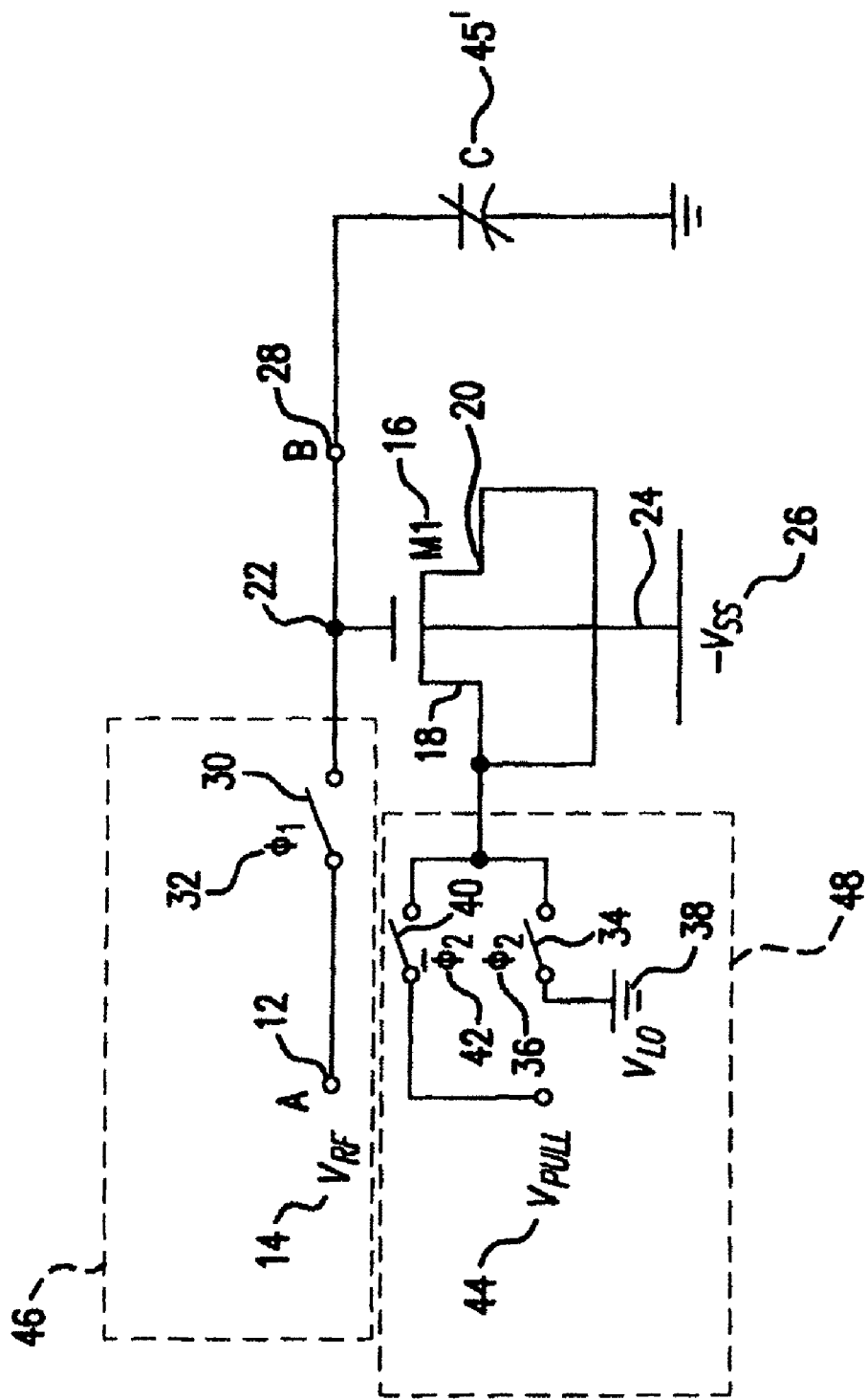
FIG. 17 shows a circuit according to another exemplary embodiment of the present invention

FIG. 17 may have particular relevance to circuits requiring a gain of 2 or other fixed gain.

FIG. 17 depicts a fourth embodiment according to the present invention. In this embodiment, which is similar to FIG. 10, a capacitor 45' may be connected in parallel with the gate terminal 22. Preferably a variable capacitor may be used. This may be used to control the gain by controlling the load.

In many applications like pipeline ADCs (analog-to-digital converters) a gain of 2 is required. The parametric amplifier has a maximum gain larger than 2. Variable gains may be attained by adjusting the voltage to which the source is boosted or by adjusting the capacitance 45' that the parametric amplifier is loaded with. In a alternate embodiment, a parametric amplifier may be put in a negative feedback loop to adjust the gain to 2, by varying either or both (the pulling voltage and/or the capacitor value) of these parameters. This may require the use of other components, such as op amps and filters to obtain sufficient loop gain.

One parametric amplifier may also be used as a master so that a controlling terminal (which may be controlling Vpull and/or the capacitor 45') required for a particular gain can be determined. This voltage can then be used for other parametric amplifiers which act as slaves to give the same gain.

Figure 18A:
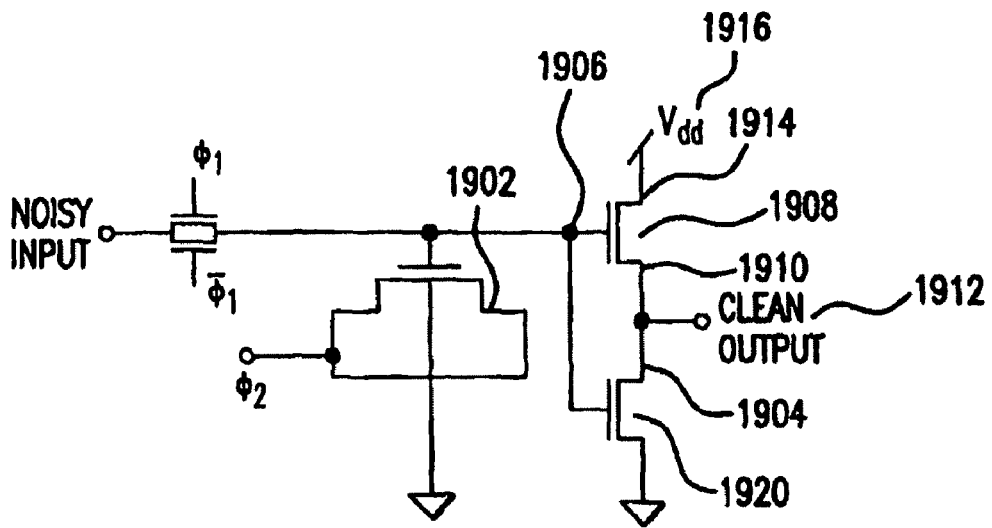
FIG. 18(a) shows a bootstrapping circuit according to another exemplary embodiment of the present invention.
Figure 18B:
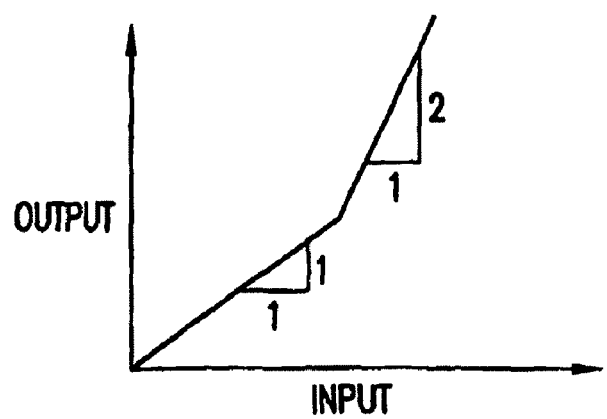
FIG. 18(b) shows the input-output characteristics of the embodiment of FIG. 18(a).

FIG. 18 may have particular relevance to selective bootstrapping circuits.

FIG. 18(*a*) depicts a fifth exemplary embodiment of such a circuit according to the present invention. The embodiment is similar to the embodiment of FIG. 10. The amplifier 1902 may be followed by a source-follower 1904. The source follower 1904 may replicate the voltage changes at it's input 1906 (ie, the gate of the amplifier) with a small loss of gain and a level shift. The follower may include a transistor 1908. The gate of this transistor 1908 may be connected to the input 1906, the source 1910 may be connected to the output 1912, the drain 1914 may be connected to the power supply 1916, and bulk may be connected to the substrate voltage (not shown). An impedance or another transistor 1920 with a fixed bias at it's gate may be connected between the output node 1912 and ground.

Although, bootstrapping circuits generally boost the signal at their input by a constant voltage irrespective of the input, the input-output characteristic of the fifth exemplary embodiment may be different. Here, if the input is smaller than a certain voltage (around the threshold voltage Vt) the value is not boosted, else the value is boosted. FIG. 18(*b*) depicts the input-output characteristic of this embodiment. For small signals, the gain (ie, slope of the input output graph) may be unity. For larger signals, the gain may be greater than one (shown as 2 in the figure).

This feature may be used to obtain a larger noise margin in digital circuits. Since the lower threshold for gates is generally fixed by the same parameters as the MOS capacitor.

It can thus be used for cleaning up the noise in incoming digital signals.

FIGS. 19-22 may have particular relevance to comparator circuits.

Figure 19:
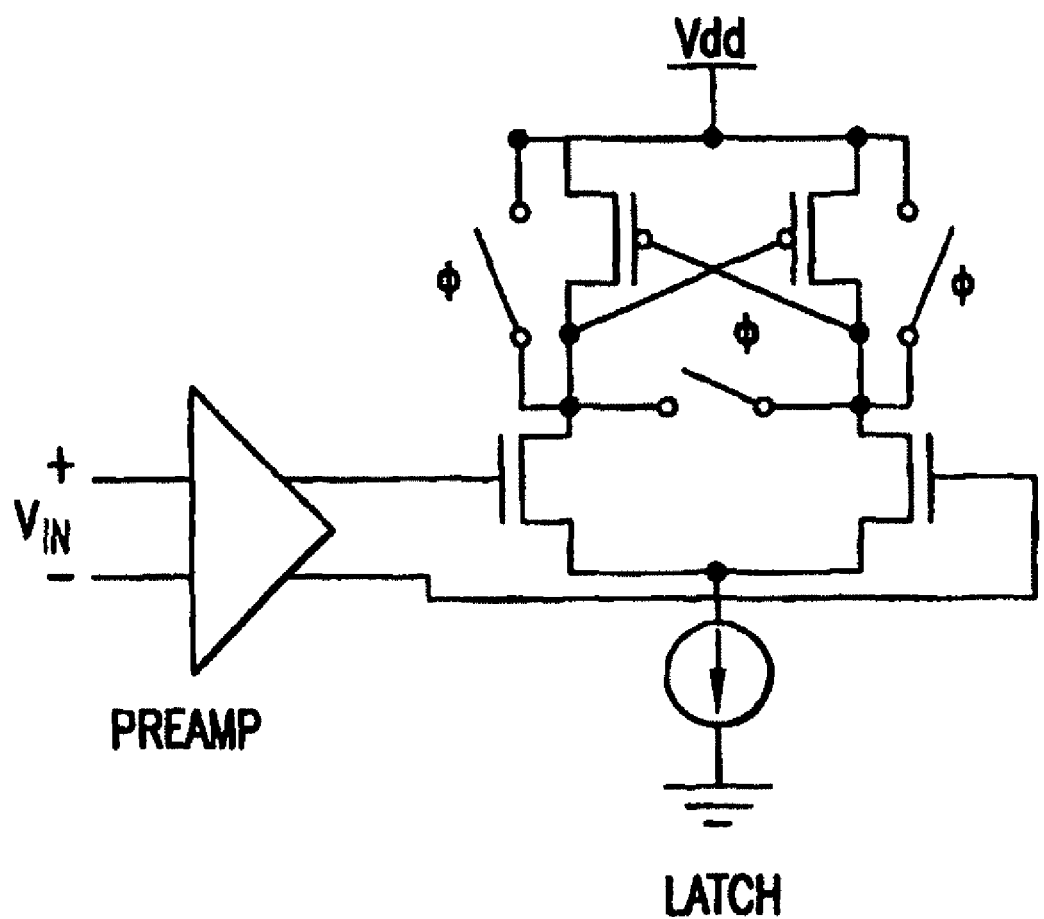
FIG. 19 shows a typical comparator used in the prior art.

A comparator is a circuit element that compares two incoming signals and gives a digital output indicating which is larger. A clocked comparator is an integral part of almost all Analog-Digital Converters (ADC). Clocked comparators generally include a latch (a positive feedback element) that takes the input voltage and ramps from rail to rail. These latches are extremely small to help them operate fast. Due to their small size and the positive feedback latches tend to have large input referred offsets. These offsets can be of the order of a hundred millivolts, which in most applications is not acceptable. To reduce the input referred offset of comparators, preamplifiers are added before this latch as shown in FIG. 19. The latch offset gets divided by gain of these amplifiers when referred to the input.

Figure 20:
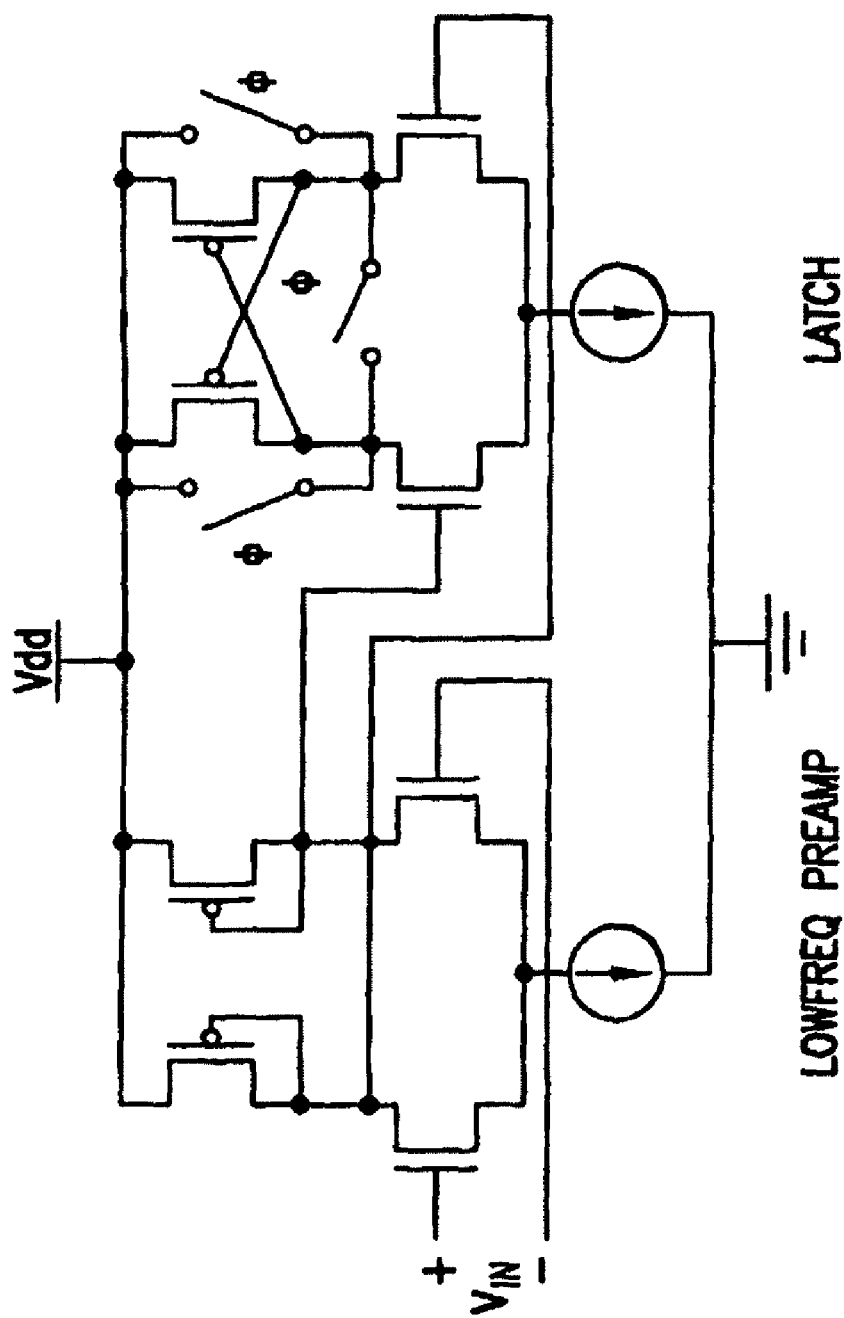
FIG. 20 shows a typical low frequency comparator used in the prior art.

The preamplifiers are generally regular differential amplifiers and a typical low frequency preamplifier is shown in FIG. 20. The gain required of the preamplifier is decided by the offset that can be tolerated in the application. Since the latch decision utilizes the value just before its evaluation and the preamplifier needs to have a bandwidth which is capable of tracking the input frequency with this gain. In comparators working at high frequencies, the bandwidth requirement of the preamplifiers is so large that only small gains can be achieved (approximately 3).

The latch only consumes dynamic power, however the preamplifier consumes static power. Since the preamplifier is also designed to have a reasonable gain over the input bandwidth they consume the majority of the power of the comparator. If the input to the preamplifier is sampled and held, then the bandwidth is determined by the amount of time given for it to settle before the evaluation of the latch.

Figure 21:
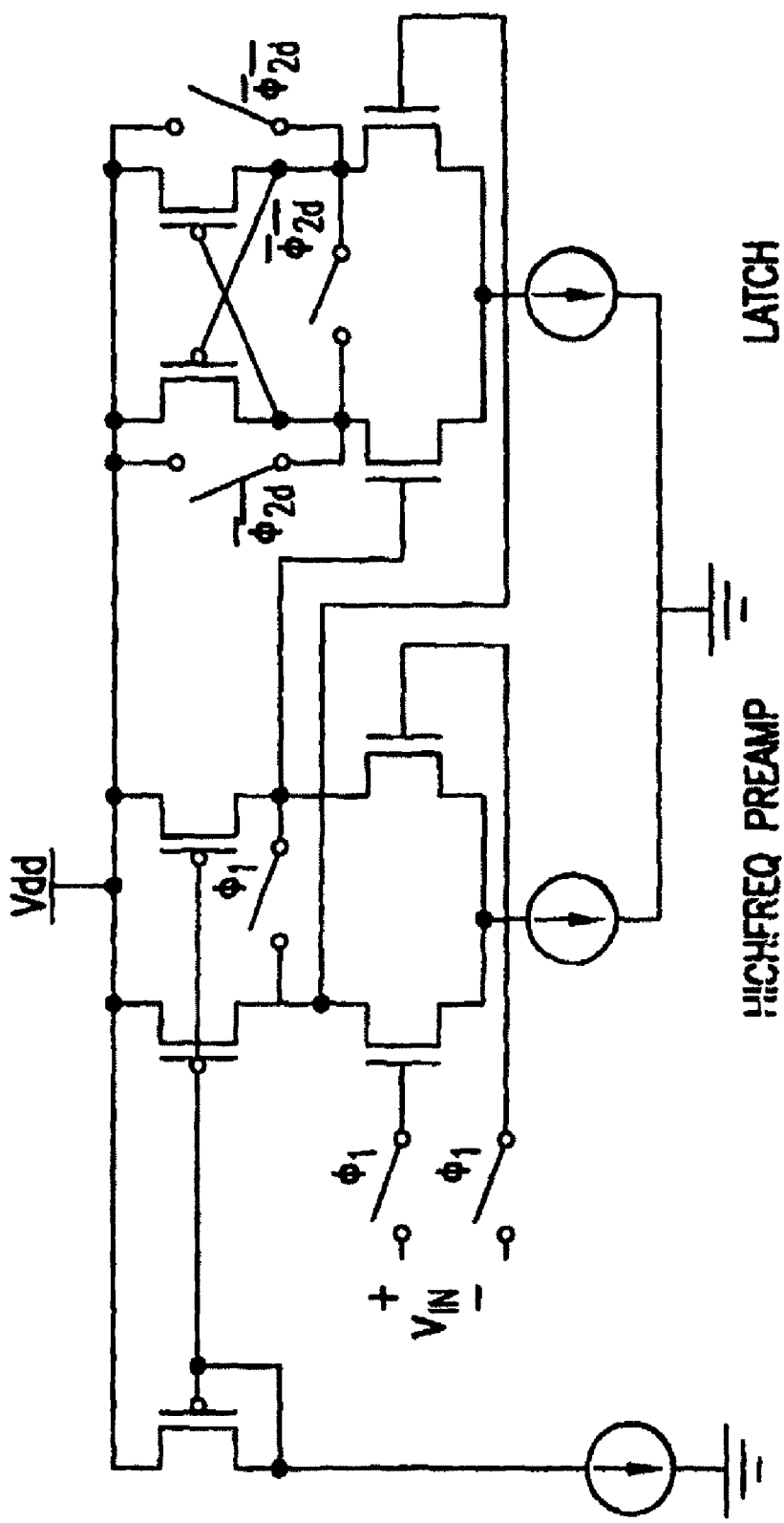
FIG. 21 shows a typical high frequency comparator used in the prior art.
Figure 22:
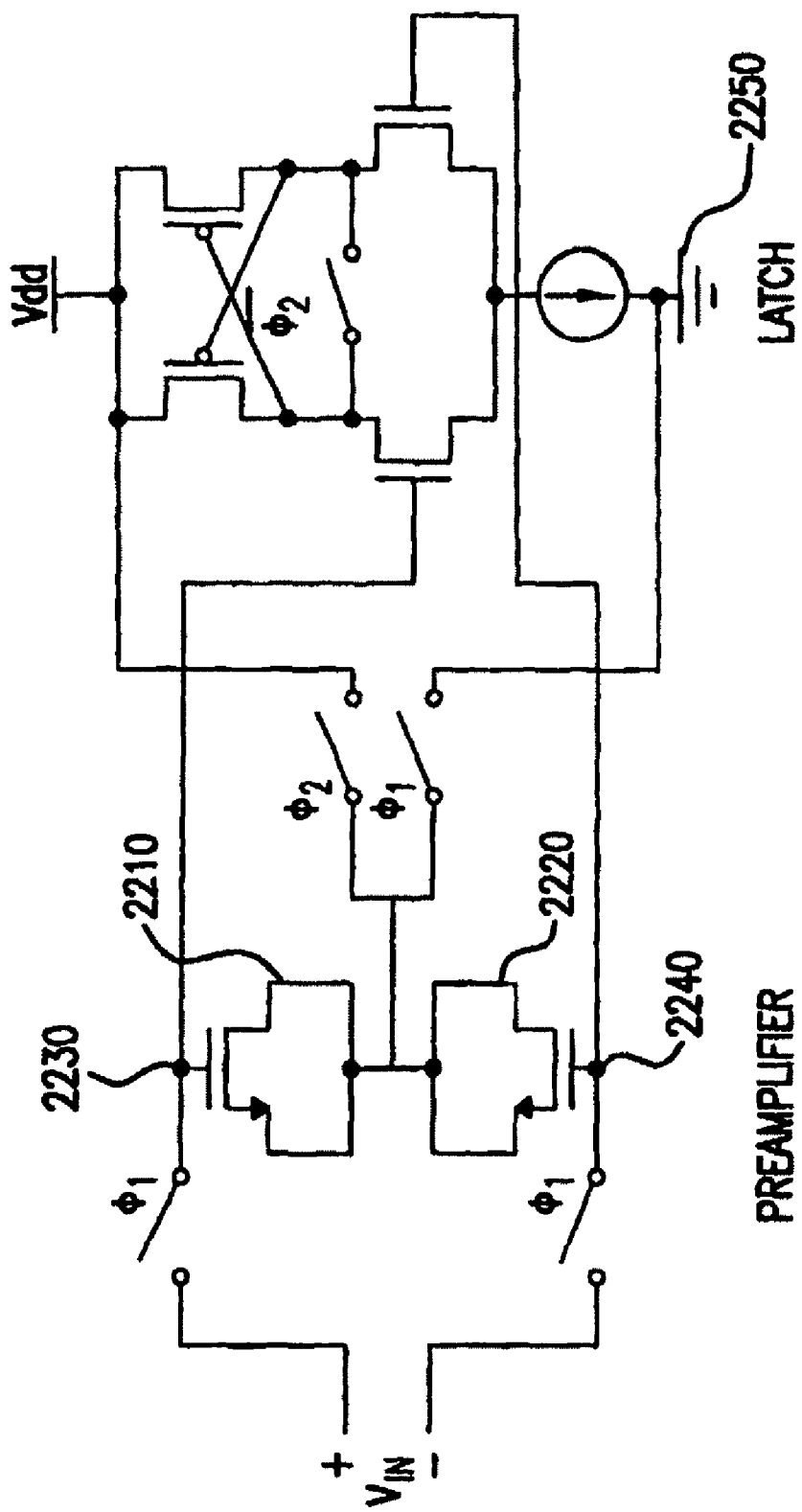
FIG. 22 shows a comparator circuit according to another exemplary embodiment of the present invention.

At high frequencies the complete settling cannot be achieved and one has to rely on the initial slope of the preamplifier or the so-called integrating preamplifiers. This preamplifier is shown in FIG. 21. For these preamplifiers, sampling the input of the preamplifier is necessary, as we only trust the initial slope and the signal cannot change in the meantime. Sampling also makes the design of preamplifiers that are part of the first stage of a subsampling converter easier.

With respect to power consumption, preamplifiers that try to settle completely for a low gain have a low impedance load and consume a great deal of static power. The preamplifiers that try to partially settle perform best with respect to power consumption. It may be possible to reduce the power utilized in the half-cycle when they are not in use. In the example given before, they were designed to have a dynamic gain of approximately 3. The preamplifiers start out with zero output voltage and then ramp up in the time available to them. The slope is proportional to the input and power dissipated. To have a fixed dynamic gain, the power dissipated has to be traded off with the time available. It should be however noted that as the output starts with zero it takes some time for the output to even equal the sampled input of the preamplifier.

The requirement of a small gain for a sampled input, at a high frequency using low power is met well by the MOSFET parametric amplifier. The topology of this comparator is shown in a sixth embodiment according to the present invention in FIG. 22. In phase φ1 the input may be sampled at the gate 2230, 2240 of the MOSFET's 2210, 2220 as well as at the input of the latch. The source and drain of MOSFET's

2210, 2220 may be connected to ground 2250 at that time. In the next non-overlapping phase φ2, the source and drain of the MOSFET's 2210, 2220 may be pulled up to Vdd. This may pull in all the inversion charge from under the gate depleting the device. The results in a boosting of the gate voltage, and in differential operation in a gain.

At the end of the sampling phase, the input voltage may already be available at the gate, which is also the input of the latch. The time taken by the amplifier to amplify may be the sum of the time it takes for the drain, source terminals to be pulled to Vdd and the time it takes to remove the inversion charge from under the gate. The first of these is the slew of the clock, which is limited by technology. The second of these is small and may depend inversely on the $f_T$ of the device, which is the fastest a transistor can operate.

The preamplifier may require no bias current. The only power that is used by the preamplifier may be used in pulling the inversion charge out from under the gate of the amplifier. If an inverter is used for switching the source between rails, it should also contribute to only the dynamic power.

The preamplifier may not only provide a differential gain but may also boost the bias level of the output with respect to the input. This may provide an increased gate voltage for the latch following the preamplifier. The voltage may be boosted beyond the supply voltage if required. This makes the design of the comparators easier since the input gate overdrive may be large. If the gain is not sufficient, the stages may be cascaded, either directly or with bias shifting circuits intermediately to obtain a larger gain in each stage. This process can be repeated many times over.

The foregoing merely illustrates the principles of the invention. Various modifications and alterations to the described embodiments will be apparent to those skilled in the art in view of the teachings herein. It will thus be appreciated that those skilled in the art will be able to devise numerous systems and methods which, although not explicitly shown or described herein, embody the principles of the invention and are thus within the spirit and scope of the invention.

We claim:

1. A circuit including an input terminal for receiving an input signal, the circuit comprising:
   a MOSFET having a source terminal, a drain terminal, a gate terminal, and a substrate terminal coupled to a substrate voltage source, the drain terminal and the source terminal being connected together;
   a first impedance associated with the input signal electrically coupled to the gate terminal and the input terminal; and
   a second impedance associated with a local oscillator signal configured to electrically couple the local oscillator signal and the source terminal.

2. The circuit of claim 1, wherein when the local oscillator signal is introduced, the local oscillator signal produces a varying voltage at the source terminal which produces a time varying impedance as seen from the gate terminal, the time varying impedance resulting in mixing of the input signal with the local oscillator signal or harmonics of the local oscillator signal.

3. The circuit of claim 1 wherein the first impedance is approximately equal to the output impedance of an input source producing the input signal.

4. The circuit of claim 1, wherein the second impedance is approximately equal to the output impedance of a local oscillator producing the local oscillator signal.

* * * * *

UNITED STATES PATENT AND TRADEMARK OFFICE
CERTIFICATE OF CORRECTION

PATENT NO. : 7,911,257 B2
APPLICATION NO. : 12/421930
DATED : March 22, 2011
INVENTOR(S) : Yannis Tsividis et al.

Page 1 of 1

It is certified that error appears in the above-identified patent and that said Letters Patent is hereby corrected as shown below:

On page 1, Column 1, line 14, please insert the following header and paragraph:

--Statement Regarding Federally Sponsored Research or Development
This invention was made with government support under grant number 0209109 awarded by the National Science Foundation. The government has certain rights in the invention.--

Signed and Sealed this
Twenty-third Day of October, 2012

David J. Kappos
*Director of the United States Patent and Trademark Office*